March 5, 1968 L. G. BAILEY ETAL 3,372,069

METHOD FOR DEPOSITING A SINGLE CRYSTAL ON AN AMORPHOUS FILM, METHOD FOR MANUFACTURING A METAL BASE TRANSISTOR, AND A THIN-FILM, METAL BASE TRANSISTOR

Filed Oct. 22, 1963

INVENTORS
Louis G. Bailey
Edward W. Mehal
BY
E. Mickey Hubbard
Attorney 3,372,069
Patented Mar. 5, 1968

3,372,069

METHOD FOR DEPOSITING A SINGLE CRYSTAL ON AN AMORPHOUS FILM, METHOD FOR MANUFACTURING A METAL BASE TRANSISTOR, AND A THIN-FILM, METAL BASE TRANSISTOR

Louis G. Bailey, Richardson, and Edward W. Mehal, Dallas, Tex., assignors to Texas Instruments Incorporated, Dallas, Tex., a corporation of Delaware Filed Oct. 22, 1963, Ser. No. 317,917
13 Claims. (Cl. 148—175)

ABSTRACT OF THE DISCLOSURE

Disclosed is a semiconductor device such as a metal base transistor and the method of making the same. A semiconducting region is formed in a semi-insulating substrate and a metal film is deposited on at least a portion of the semiconducting region. Epitaxial growth is initiated on the substrate around the metal film and continued until the epitaxial growth reaches the upper surface of the metal layer, and then further continued so that the epitaxial growth extends in a lateral direction over the metal film.

The present invention relates to semiconductor devices, and more particularly but not by way of limitation, relates to a method for depositing a single crystal structure on a metallic or other film having a dissimilar crystal structure, and still more particularly, relates to a method for manufacturing a thin film metal base transistor and to the metal base transistor itself.

It has been recognized that a metal base transistor has several theoretical advantages over any other transistor-type, current-controlled device. For example, it has been shown that the ultimate theoretical value of the alpha cut-off frequency $f_a$ would be on the order of $2\times10^{10}$ c.p.s. and the maximum frequency of oscillation $f_{max}$ would be on the order of $1\times10^{11}$ c.p.s. In both cases, the values are a factor of two better than the corresponding values which could be theoretically expected from any other transistor-type, current-controlled device.

The metal base transistor also has a low input impedance, a high output impedance, a current gain which is essentially independent of current level, and a low feedback factor. Stable base conditions are established by the input (emitter) current and output (collector) voltage. Input voltage is considered a dependent vairable determined uniquely by the input current. In the common base configuration, power gain is realized in these devices by virtue of the ratio of output to input impedance. The normally preferred common emitter configuration provides both current and voltage gain.

The high-frequency limit, $f_a$, of the metal base transistor is determined by the relaxation time of the emitter base structure together with the collector transit time. For hot electron transport across the thin metallic base layer in this type of device, the base transit time, approximately $10^{-12}$ seconds, is negligible. The extremely low base spreading resistance offered by the metallic base layer also reduces the internal feedback factor and increases the Q at the output terminals in contrast with a conventional transistor. These effects combine to produce useful power gain at frequencies significantly higher than $f_a$.

A thin film metal base transistor also offers the possibility of performing satisfactorily under conditions known to be detrimental to semiconductor minority-carrier devices. For example, the metal base transistor should be relatively immune from radiation effects due to the majority-carrier aspects of the device because degradation of minority-carrier lifetime is not a concern under these conditions. This factor is important in considering the design of electronic systems for nuclear reactor or space applications where components are subjected to radiation fields.

It is believed that metal base transistors have been heretofore constructed only under laboratory conditions and that all previous work has been with either Ge or Si, or combinations thereof. It is reported by D. V. Geppert in Proceedings of the IRE 50, p. 1527 (1962), that copper was electroplated on n-type Ge having a resistivity of 2 ohm-cm. to form a large area collector barrier. Then the blunt corner of a second n-type Ge crystal with the same resistivity was pressed against the thin copper film to serve as an emitter. Another approach was reported at the 1962 Solid State Device Research Conference by M. M. Atalla and D. Kahng wherein Au was evaporated onto the cleaved surfaces of n-type Ge. Then the blunt corner of an n-type Si crystal was placed against the Au film and the electrical characteristics measured. Both of these approaches were intended only to prove feasibility of the metal base transistor concept, and were not intended, and did not yield a permanent type structure.

In an attempt to fabricate a more permanent structure, Sprague et al., reported at the Twenty-Third Annual Conference on Physical Electronics that a thin film of Au or Cr was deposited onto the surface of single crystal n-type Si and then a single crystal layer of n-type Si deposited on top of the Au or Cr. However, the inability to make electrical contact with the thin film prevented checking the electrical characteristics of the device.

As is well-known in the art, it is virtually essential that both of the semi-conducting regions of a transistor or other semiconductor device be of single crystal structure. Therefore, perhaps the most significant problem in the manufacture of a metal base transistor, particularly of the thin film type, lies in producing the single crystal structure on each side of the metal film forming the transistor base. One method of obtaining such a result would be the epitaxial deposition of the metallic film on a single crystal active semiconductor material, and then the epitaxial deposition of the second semiconductor layer on the metal film. However, at the present time, we do not know of a metal having the proper crystal structure for epitaxial deposition upon a semiconductor material which also has the necessary electrical, physical and chemical properties for the present application, and no methods are presently known for producing a transistor using this straightforward technique. Further, it is unnecessary for the metal base to be of single crystal construction so that the added difficulty and expense of depositing such a layer is unwarranted if another suitable approach is available.

The present invention contemplates a novel method for depositing a single crystal structure over a surface having a dissimilar crystal structure which is particularly adapted to manufacturing a transistor having a thin film metal base disposed between two single crystal active semiconductor regions. Broadly, the method entails the epitaxial formation of a semiconductor material on a single crystal substrate of similar or identical crystal structure and causing the single crystal deposit to grow or spread over an adjacent surface, such as metal, having a dissimilar crystal structure. In the present specification and appended claims, the term epitaxy is used in its broader sense to include the oriented growth of a single crystal upon a single crystal of either identical or similar crystal structure.

In its more limited aspects, the present invention contemplates a method for manufacturing a metal base transistor comprising the steps of producing an active semiconductor region on a single crystal semi-insulating substrate, depositing a metal layer over a portion of the active semiconductor region, and epitaxially depositing a second active semiconductor layer on the semi-insulating substrate in such a manner that the second active semiconductor material will be formed in a single crystal extending over the metal layer, which may have an amorphous or dissimilar crystal structure.

The metal base transistor constructed in accordance with the present invention comprises a single crystal, semi-insulating substrate, a first active semi-conducting region on the substrate, a thin metallic film over the first active semiconducting region, and a second single crystal active semiconducting region over the thin metallic region and epitaxially connected to the semi-insulating substrate, the first and second active semi-conducting regions being physically isolated by the thin metallic film, and means for establishing electrical contact with the first and second active semi-conducting regions and the metal film.

Therefore, it is an important object of the present invention to provide a method for depositing a single crystal structure over a structure having a dissimilar crystal structure.

Another object of this invention is to provide a method for manufacturing a metal base transistor.

Yet another object of the present invention is to provide an improved method for economically manufacturing thin film, metal base transistors which may be integrated into thin film circuits.

A still further object of the present invention is to provide a thin film metal base transistor.

Another object of the present invention is to provide an improved transistor which may be subjected to greater radiation without harm and which has improved frequency characteristics.

Additional objects and advantages of the present invention will be evident to those skilled in the art from the following detailed description and drawings, wherein.

Figure 1:
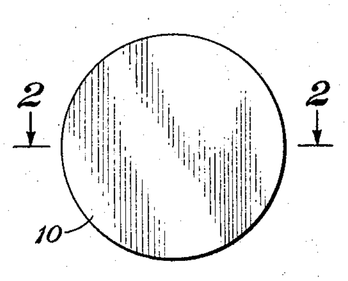
FIGURE 1 is an enlarged schematic drawing of a substrate and serves to illustrate the method of the present invention.
Figure 2:
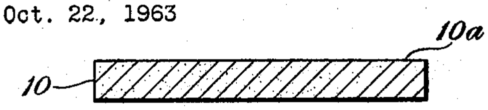
FIGURE 2 is a schematic sectional view taken on lines 2—2 of FIGURE 1.
Figure 4:
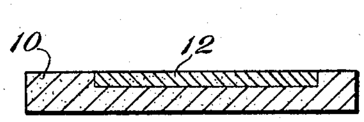
FIGURE 4 is a schematic sectional view taken on lines 4—4 of FIGURE 3.

Referring now to the drawings, FIGURE 1*a* is a top view of a single crystal, semi-insulating substrate in which the crystallographic [111] plane forms the upper surface 10*a*, as can be seen in the sectional view of FIGURE 2. An active semi-conducting region 12 is formed over a predetermined area of the surface 10*a* of the substrate 10 either by diffusing the proper dopants into the semi-insulating substrate or by epitaxially depositing a layer of active semi-conducting material on the substrate. The diffusing technique is illustrated in FIGURE 4. Each of these techniques is well-known to those skilled in the art. The active semi-conducting region 12 does not cover the entire semi-insulating substrate 10 and is preferably somewhat elongated so as to provide a relatively narrow area for crystal overgrowth as will presently be described. The area of the region 12 can be controlled by suitable and well-known masking techniques. As can be seen in FIGURE 4, the active region 12 is preferably counterset in the substrate 10 so as to have a common upper surface, and this is more easily accomplished by diffusion of the dopant into the semi-insulating substrate. However, it is to be understood that the active region 12 may be deposited as a thin film upon the surface of the substrate 10 without departing from the broad scope of the present invention.

Figure 5:
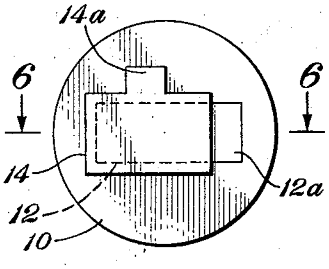
FIGURE 5 is an enlarged schematic drawing illustrating yet another step of the method of the present invention.
Figure 6:
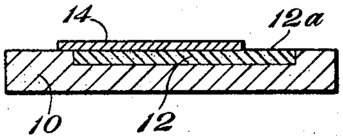
FIGURE 6 is a schematic sectional view taken on lines 6—6 of FIGURE 5.

Next, a metallic film 14 is deposited over a major portion of the active region 12 substantially as illustrated in FIGURE 5. Again the area of deposition can be controlled by masking. It will be noted that a tab portion 12*a* of the active region 12 is not covered so as to provide an electrical contact for the first active semi-conducting region. However, it will be noted that the metal film 14 extends out past the edges of the active region 12 except for the tab portion and covers a portion of the semi-insulating substrate 10 for insulation purposes, as will hereafter be described in greater detail. A tab portion 14*a* of the metallic film 14 is also formed to provide a means for establishing electrical contact with the metal film. The metallic film 14 should be as thin as possible and should be very dense and closely bonded to the active semiconductor region 12, but need not be a single crystal.

Figure 7:
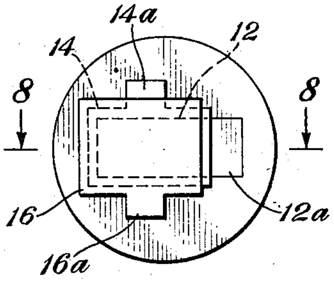
FIGURE 7 is an enlarged schematic top view of a metal base transistor constructed in accordance with the present invention which also serves to illustrate the final step of the method of the present invention.
Figure 8:
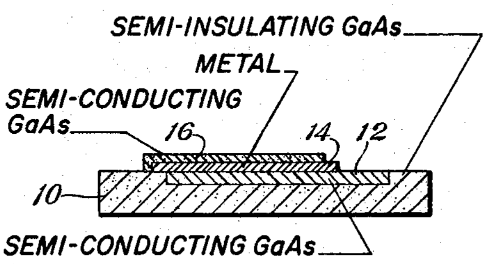
FIGURE 8 is a schematic sectional view taken on lines 8—8 of FIGURE 7.

Next a semi-conducting material having a crystallographic structure adapted for epitaxial growth on the substrate 10 is epitaxially deposited in the area illustrated in FIGURE 7 to produce a second active semi-conducting region 16. It will be noted that the active region 16 extends around the periphery of the metallic film 14 so as to be initially deposited on the single crystal semi-insulating substrate 10, yet is properly masked so as not to extend over the tab portion 12*a* of the first semiconductor region 12. A tab portion 16*a* is also provided on the semi-conducting material 16 for electrical contact purposes. Since the semiconductor material 16 must be epitaxially deposited on the semi-insulating substrate 10, the two materials must have epitaxially compatible crystallographic structures. In practice, the substrate and the active semi-conducting region may conveniently be formed from the same material except for the impurities which make the material either semi-insulating or semi-conducting in a manner well known in the art.

As the epitaxial deposition process is carried out, the semi-conducting material 16 forms on the single crystal substrate 10 rather than on the metal film 14 and each nucleated layer tends to spread at a much greater rate in the [111] plane, which it will be recalled forms the surface 10*a*. Thus successive crystalline layers build on the substrate 10 around the periphery of the metal layer 14 until the layer is of greater thickness than the metal film 14. Then the tendency to grow in the [111] plane parallel to the surface 10*a* causes the semi-conducting single crystal deposit to spread over the metal layer 14 and form a single crystal structure. This results in a transistor device indicated generally by the reference numeral 18 having single crystal, active semi-conducting regions 12 and 14 disposed on either side of a thin metal film 14, which serves as the base of the transitor. Electrical contact can be made with the transistor device through the tabs 12*a*, 14*a*, and 16*a* which would be considered the collector, base and emitter, respectively.

In accordance with the broader aspects of the present invention, any single crystal substrate having the desired electrical characteristics and the desired crystal structure can be used to practice the method of the present invention. However, GaAs in the semi-insulating form having a resistivity on the order of $10^8$ ohm-cm. is preferred for the substrate 10. The semi-insulating GaAs will provide both electrical isolation for active components deposited thereon and also a crystalline surface onto which single crystal semiconductor depositions can be made by well-known epitaxial techniques as well presently be described in greater detail. In particular, GaAs semiconductor material can be epitaxially deposited on the GaAs semi-insulating substrate, and GaAs offers a good compromise as between the high temperature required for the deposition process and the desired band gap for the semiconductor that forms the emitter. A low deposition temperature for the semi-conducting single crystal is necessary in order to minimize interdiffusion of the metal and semiconductor films, and also to minimize surface migration of the atoms in the metal film and their coalescence into islands.

Ge can be used for the semi-insulating substrate and the semi-conducting regions. However, even though Ge has a low epitaxial deposition temperature comparable to that of GaAs, it has too low a band gap for good emission efficiency at low values of emitter current. Si can also be used for the active regions and offers a better band gap than Ge, but requires a high temperature for epitaxial deposition. For example, the current halide reduction process for Si can be operable at temperatures as low as 900° C., while the physical process of evaporation requires substrate temperatures near 1200° C. In contrast, GaAs has a band gap higher than Si, namely, 1.42 e.v. at room temperature, and requires substrate temperatures of only about 750° C., for epitaxial deposition either by chemical transport, or by physical transport, such as by sputtering for example.

An additional reason why GaAs is preferred is that the higher band gap of GaAs permits the semiconductor device to be operated at higher temperatures than would be possible with either Ge or Si. Still another reason why GaAs is preferred for the semi-insulating substrate and also the active semiconductor regions is that the transistor device can be easily included in micro-circuitry of the type which utilize metallic films evaporated onto a GaAs substrate to form resisters, conducting pathways, and capacitors comprised of alternate layers of metal and dielectric films. For example, metal conducting pathways could be deposited to contact the tab portions **12*a*, 14*a* and 16*a*** of the transistor during the step when the metal film is deposited.

One of the important aspects of the present invention is that a wide range of metals can be used to form the thin metallic film which serves as the transitor base. As previously mentioned, this is permitted because the metal film may be an amorphous or polycrystalline layer and no particular crystal structure is required due to the novel technique for depositing the second single crystal active semi-conducting region 16 as previously described. However, the particular metal used for the metallic film should be chosen with the following characteristics in mind: (1) range of electrons emitted into the metal, (2) melting point, (3) ease of deposition, (4) solubility in GaAs or other semi-insulating and semi-conducting materials used for the substrate and active regions of the semi-conductive device, (5) rate of diffusion in the GaAs or other material, (6) work function, (7) resistance to surface contamination once deposited, and (8) ease of surface cleaning prior to deposition of the second GaAs or other semiconductor layer.

One specific method for manufacturing a metal base transistor comprises producing the first active semi-conducting region of GaAs 12 on the semi-insulating GaAs substrate 10. This step can be performed by conventional and well-known means employing either chemical transport epitaxy or, preferably, a simple localized diffusion out of a doped oxide mask as described in a paper presented at the Pittsburgh meeting of The Electrochemical Society, April 15–18, 1963, by Shortes and E. C. Wurst. This produces an active semiconductor region within the previously semi-insulating substrate over the area illustrated in FIGURES 1 and 2.

The doped substrate is then placed in a sputtering apparatus of the general type described at p. 159 of Procedures in Experimental Physics, by John Strong, 1938. In general, the sputtering apparatus comprises a means for controlling the atmosphere at low pressure, a cathode of the material to be sputtered onto the substrate, and electrical connection means for making the substrate the anode. The surface of the active semi-conducting region 12 is then cleaned by argon ion bombardment in a low pressure discharge using the techniques described generally in the paper entitled "Ion Bombardment-Cleaning of Ge and Ti as Determined by Low-Energy Electron Diffraction," Journal of Applied Physics, 26, p. 252 (1955), and "Preparation and Regeneration of Clean Ge Surfaces," Journal of Applied Physics, 29, p. 1132 (1958). This step can easily be carried out in the sputtering apparatus because argon is usually present in the apparatus to carry out the sputtering process.

Figure 3:
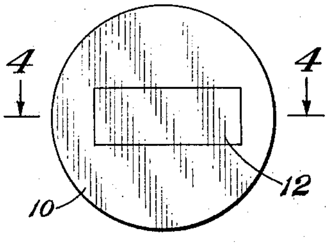
FIGURE 3 is an enlarged schematic drawing similar to FIGURE 1 which serves to illustrate another step of the method of the present invention.

A suitable mask is then placed over the substrate and the chosen metal, such as Ta or Pt is sputtered onto the surface to a predetermined thickness in the area 12 indicated in FIGURE 3. The thickness and coherence of the metal film may be controlled by previously calibrating the various sputtering variables by means of trial and error and examination of the film by electron microscopy.

Next, without opening the sputtering chamber, the mask for the metal film deposition is exchanged for a mask to limit the deposition of the semi-conducting material to the zone 16 illustrated in FIGURE 7. The metal cathode is also changed to one of either GaAs or metallic Ga. The GaAs is then sputtered directly onto the semi-insulating substrate where it grows epitaxially as a single crystal and covers over the metallic film as previously described. If a Ga cathode is used, the sputtering takes place in either an arsenic or argon-arsenic atmosphere to produce the GaAs epitaxial layer.

As previously mentioned, the second active semi-conducting GaAs layer is deposited epitaxially first on the unmasked portion of the single crystal GaAs substrate around the periphery of the metal film 14. The GaAs deposit grows at a much greater rate in the [111] surface plane than in the direction normal to the surface plane so that a series of layers are nucleated on the surface of the substrate. Each layer tends to fill out before the next layer is nucleated until the GaAs crystal reaches the top of the metal film, at which time the top nucleated layer spreads over the metal film and covers it to produce a semi-conducting GaAs single crystal structure. The manufacture of the metal base transistor device 18 is then completed.

The sputtering technique described above has several advantages. Only a single reactor is required for the deposition of the metal film and the final semiconductor region, and the masking steps can be done within the single reactor so that contamination of the films during transfer from one reactor to another or during the masking process is avoided. Also the reaction of the metal film with vapor-phase species during deposition of the final active GaAs layer is minimized.

An alternate method for depositing the metal film 14 and second semi-conducting region 16 involves chemical transport techniques. For example, the metal film 14 could be deposited by a hydrogen reduction of a volatile metal halide, $MCl_x$, such as by the reaction:

$$MCl_x(g) + \frac{1}{2}xH_2(g) \xrightarrow{\Delta} M(s) + xHCl(g) \quad (1)$$

Epitaxial deposition of the final semi-conducting GaAs layers 16 may be accomplished by a conventional technique involving the reaction of a volatile halide with Ga or GaAs, transportation of this gas mixture to a cooler part of the reactor, and deposition on the masked substrate. A feed reaction to provide a volatile Ga halide might be:

$$AsCl_3(g) + 3GaAs(s) \xrightarrow[H_2]{900°\ C} 3GaCl(g) + As_4(g) \quad (2)$$

Then using a disproportionation reaction at lower temperatures, the following reaction would take place:

$$3GaCl(g) \xrightarrow[H_2]{750^\circ C} 2Ga(g) + GaCl_3(g) \quad (3)$$

Formation of GaAs on or near the surface would then result from the equation:

$$4Ga(g) + As_4(g) \xrightarrow[H_2]{750^\circ C} 4GaAs(s) \quad (4)$$

The chemical transport and deposition approach also has the advantage of utilizing a single reactor. The input gases for the metal and GaAs depositions can be switched from one to the other while the previously deposited surface is protected by an inert atmosphere.

From the above detailed description of several preferred embodiments of the present invention, it will be evident that a very useful method for depositing a single crystal structure on an epitaxially incompatible surface, such as an amorphous or polycrystalline metal film, has been described. A method for manufacturing a thin film, metal base transistor has been described which can be used with thin film circuits, particularly of the type employing semi-insulating GaAs as a substrate. An improved transistor has also been described which has improved frequency characteristics and which is less subject to the adverse effects of radiation.

Although several preferred embodiments of the invention have been described in detail, it is to be understood that various changes, substitutions and alterations can be made therein without departing from the spirit and scope of the invention as defined by the appended claims.

What is claimed is:

1. A method for depositing a single crystal structure over a polycrystalline surface comprising:
   - epitaxially growing a first single crystal structure in a first direction from a second single crystal structure having a polycrystalline layer on at least a portion of the surface thereof until said first single crystal structure reaches the upper surface of said polycrystalline layer, and
   - continuing the epitaxial growth process in both said first direction and in a lateral direction over said upper surface so that the grown single crystal structure is in intimate contact with said upper surface.

2. A method for depositing a single crystal structure over an amorphous surface comprising:
   - epitaxially growing a first single crystal structure in a first direction from a second single crystal structure having an amorphous layer on at least a portion of the surface thereof until satid first single crystal structure reaches the upper surface of said amorphous layer, and
   - continuing the epitaxial growth process in both said first direction and in a lateral direction over said upper surface so that the grown single crystal structure is in intimate contacte with said amorphous surface.

3. A method for manufacturing a metal base transistor from a starting material of a single crystal semi-insulating substrate having a first semi-conducting region therein comprising the steps of:
   - depositing a metal film of a surface portion of said first semi-conducting region, and
   - epitaxially growing a second single crystal semiconducting region from a surface portion of the substrate until said second single crystal semiconducting region reaches the upper surface of said metal film, and
   - continuing the epitaxial growth process in both said first direction and in a lateral direction over said metal film surface so that said grown single crystal structure is in intimate contact with said metal film surface.

4. A method for manufacturing a metal base transistor comprising the steps defined in claim 3 wherein:
   - the first semi-conducting region is produced on the semi-insulating substrate by diffusing a dopant into the semi-insulating substrate in a predetermined region.

5. A method for manufacturing a metal base transistor comprising the steps defined in claim 3 wherein:
   - the first semiconducting region on the semi-insulating substrate is produced by epitaxially depositing a single crystal semi-conducting region on the substrate.

6. A method for manufacturing a metal base transistor comprising the steps defined in claim 3 wherein:
   - the metal film is deposited over a portion of the first semi-conducting region by sputtering.

7. A method for manufacturing a metal base transistor comprising the steps defined in claim 3 wherein:
   - the metal film is deposited over a portion of the first semi-conducting region by a chemical transport technique.

8. A method for manufacturing a metal base transistor comprising the steps defined in claim 3 wherein:
   - the second single crystal semi-conducting region is epitaxially grown on the substrate and over the metal film surface by sputtering.

9. A method for manufacturing a metal base transistor comprising the steps defined in claim 3 wherein:
   - the second single crystal semi-conducting region is epitaxially grown on the substrate and over the metal film surface by a chemical transport technique.

10. A method for manufacturing a metal base transistor comprising the steps defined in claim 3 wherein:
    - the semi-insulating substrate is gallium arsenide (GaAs).

11. A method for manufacturing a metal base transistor comprising the steps defined in claim 3 wherein:
    - the semi-insulating substrate and the first and second semi-conducting regions are all gallium arsenide (GaAs).

12. A method for manufacturing a metal base transistor comprising the steps defined in claim 6 wherein:
    - the semi-insulating substrate and the first and second semiconducting regions are all gallium arsenide, and the second single crystal semiconducting region is epitaxially grown on the substrate and over the metal film surface by sputtering.

13. A method for manufacturing a metal base transistor comprising the steps defined in claim 7 wherein:
    - the semi-insulating substrate and the first and second semiconducting regions are all gallium arsenide, and the second single crystal semiconducting region is epitaxially grown on the substrate and over the metal film surface by a chemical transport technique.

References Cited

UNITED STATES PATENTS

| | | | |
|---|---|---|---|
| 3,094,650 | 6/1963 | Riegert | 148—174 |
| 3,121,809 | 2/1964 | Atalla | 317—235 |
| 3,131,305 | 4/1964 | Shombert | 148—33.5 |
| 3,139,361 | 6/1964 | Rasmanis | 148—174 |
| 3,149,395 | 9/1964 | Bray et al. | 148—175 |
| 3,165,811 | 1/1965 | Kleimack et al. | 148—175 |
| 3,171,762 | 3/1965 | Rutz | 148—175 |
| 3,218,205 | 11/1965 | Ruehrwein | 148—175 |
| 3,250,966 | 5/1966 | Rose | 317—235 |

OTHER REFERENCES

Pashley—"Study of Epitaxy in Thin Surface Films"—Advances in Physics, April 1956, p. 199.

Lyons IBM Technical Disclosure Bulletin, vol. 5, No. 10, March 1963, pp. 117–118.

DAVID L. RECK, *Primary Examiner.*

P. WEINSTEIN, N. F. MARKVA, *Assistant Examiners.*

UNITED STATES PATENT OFFICE
CERTIFICATE OF CORRECTION

Patent No. 3,372,069 March 5, 1968

Louis G. Bailey et al.

It is certified that error appears in the above identified patent and that said Letters Patent are hereby corrected as shown below:

Column 1, line 49, "vairable" should read -- variable --. Column 4, line 75, "well" should read -- will --. Column 5, line 9, "diflusion" should read -- diffusion --; line 36, "resisters" should read -- resistors --. Column 7, line 52, "satid" should read -- said --; line 58, "contacte" should read -- contact --; line 64, "of" should read -- over --.

Signed and sealed this 30th day of September 1969.

(SEAL)
Attest:

Edward M. Fletcher, Jr.
Attesting Officer

WILLIAM E. SCHUYLER, JR.
Commissioner of Patents